(12) United States Patent
Risaki et al.

(10) Patent No.: US 9,299,629 B2
(45) Date of Patent: Mar. 29, 2016

(54) SEMICONDUCTOR DEVICE AND MANUFACTURING METHOD THEREFOR

(75) Inventors: Tomomitsu Risaki, Chiba (JP); Shoji Nakanishi, Chiba (JP); Koichi Shimazaki, Chiba (JP)

(73) Assignee: SEIKO INSTRUMENTS INC. (JP)

( * ) Notice: Subject to any disclaimer, the term of this patent is extended or adjusted under 35 U.S.C. 154(b) by 641 days.

(21) Appl. No.: 12/932,560

(22) Filed: Feb. 28, 2011

(65) Prior Publication Data

US 2011/0221043 A1    Sep. 15, 2011

(30) Foreign Application Priority Data

Mar. 15, 2010   (JP) .................................. 2010-058449

(51) Int. Cl.
*H01L 21/78* (2006.01)
*H01L 23/29* (2006.01)
*H01L 23/00* (2006.01)
*H01L 23/58* (2006.01)

(52) U.S. Cl.
CPC .............. *H01L 23/293* (2013.01); *H01L 21/78* (2013.01); *H01L 23/562* (2013.01); *H01L 23/585* (2013.01); *H01L 2924/0002* (2013.01)

(58) Field of Classification Search
CPC .............. H01L 23/585; H01L 2924/00; H01L 2924/0002; H01L 21/3043
USPC ............................ 257/620; 438/460, 703, 533
See application file for complete search history.

(56) References Cited

U.S. PATENT DOCUMENTS

| | | | | |
|---|---|---|---|---|
| 5,024,970 A | * | 6/1991 | Mori | 148/DIG. 28 |
| 5,136,354 A | * | 8/1992 | Morita et al. | 257/620 |
| 5,593,925 A | * | 1/1997 | Yamaha | 438/703 |
| 7,087,452 B2 | * | 8/2006 | Joshi et al. | 438/68 |
| 2006/0068567 A1 | * | 3/2006 | Beyne et al. | 438/460 |
| 2009/0269912 A1 | * | 10/2009 | Grivna et al. | 438/533 |

OTHER PUBLICATIONS

Patent Abstracts of Japan, publication No. 01-309351, publication date Dec. 13, 1989.

* cited by examiner

*Primary Examiner* — Jerome Jackson, Jr.
*Assistant Examiner* — Fang-Xing Jiang
(74) *Attorney, Agent, or Firm* — Adams & Wilks

(57) ABSTRACT

A semiconductor device has a semiconductor substrate provided with a scribe region and an IC region. A first insulating film is disposed on the semiconductor substrate across the scribe region and the IC region. At least one separation groove is provided in the first insulating film in the scribe region. Side walls made of a plug metal film are formed only on respective lateral walls of the separation groove so that the plug metal film on the lateral walls does not extend out of the separation groove and does not exist on an upper surface of the first insulating film. A second insulating film covers at least the side walls formed on the respective lateral walls of the separation groove so that the side walls are disposed under the second insulating film.

15 Claims, 5 Drawing Sheets

PRIOR ART

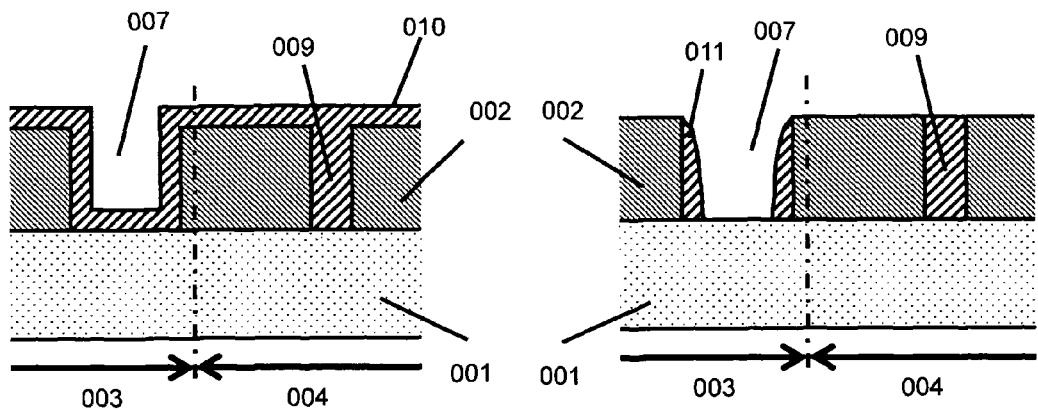
FIG. 7A
FIG. 7B
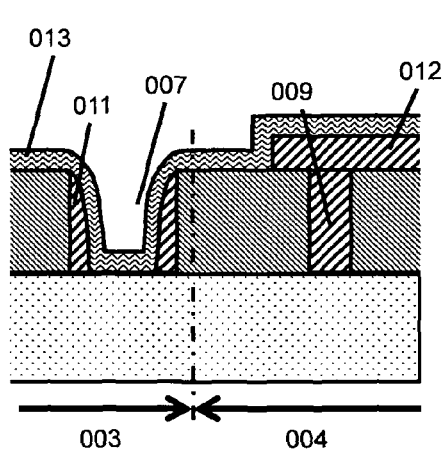
FIG. 7C
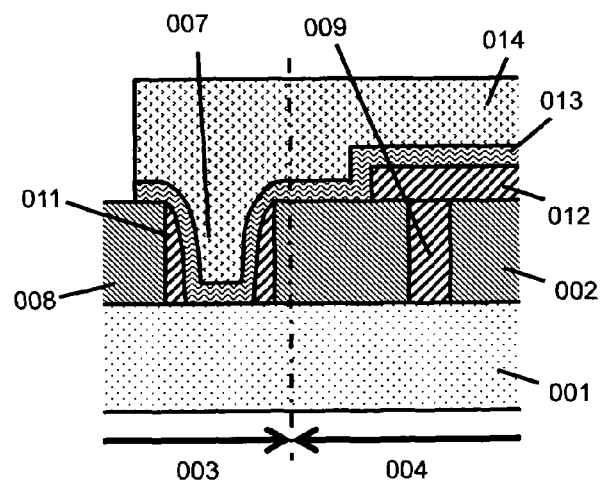
FIG. 7D

SEMICONDUCTOR DEVICE AND MANUFACTURING METHOD THEREFOR

BACKGROUND OF THE INVENTION

1. Field of the Invention

The present invention relates to a semiconductor device suitable for preventing film peeling due to dicing and for restraining abnormal discharge during etching.

2. Description of the Related Art

Dicing technology, which divides a semiconductor wafer into semiconductor chips, is indispensable for producing semiconductor chips. However, film peeling sometimes occurs due to an impact of dicing or handling of the semiconductor chip after dicing. FIGS. 3A and 3B are cross-sectional views illustrating a problem of film peeling inherent in a conventional semiconductor device. FIG. 3A illustrates a cross-sectional view before dicing and FIG. 3B illustrates a cross-sectional view after dicing. In a structure having an inter-layer insulating film 002 deposited on a semiconductor substrate 001, dicing along a scribe region 003 between pluralities of IC regions 004 causes damage due to penetration from each end surface of semiconductor chips in contact with a region 006 which is cut and removed by dicing. Then, the laminated inter-layer insulating film 002 peels off from the semiconductor substrate 001 as illustrated in FIG. 3B, with the result that a film peeling portion 005 may appear even in the IC region 004.

As a method for preventing the film peeling caused by dicing, physical separation of the films deposited on the semiconductor substrate is offered (see, for example, Japanese Patent Application Laid-open No. H01-309351). FIGS. 4A and 4B are cross-sectional views of a semiconductor device which employs the above-mentioned method to take measures against film peeling. FIG. 4A illustrates a cross-sectional view before dicing and FIG. 4B illustrates a cross-sectional view after dicing. Separation grooves 007 are provided in the inter-layer insulating film 002 in the vicinity of boundaries between the scribe region 003 and the IC regions 004, so as to physically separate the inter-layer insulating films 002 between the respective regions. When dicing is performed as illustrated in FIG. 4B, the inter-layer insulating films 002 in the vicinity of the end surfaces of the semiconductor chips in contact with the cut and removed region 006 are damaged to peel off and scatter from the semiconductor substrate 001 as small pieces 008, whereas no damage propagates through portions without the inter-layer insulating films 002, causing no peeling of the inter-layer insulating films 002 in the IC regions 004.

However, the applicant has found through research that the following problem arises if the above-mentioned conventional technology is applied to a semiconductor device having a metal plug. FIGS. 5A to 5D are cross-sectional views illustrating a difficulty which occurs when the conventional technology and the plug technology are used in combination. FIG. 5A illustrates a cross section in which the separation groove 007 is provided in the inter-layer insulating film 002 on the semiconductor substrate 001, and a plug metal film 010 is thereafter deposited on the inter-layer insulating film 002 and an exposed part of the semiconductor substrate 001. A contact hole 009 with a small opening is completely filled with the plug metal film 010, whereas the separation groove 007 with a large opening is not filled with the metal film but the plug metal film 010 is deposited along a bottom part and lateral walls of the separation groove 007. FIG. 5B illustrates a cross section after the deposited plug metal film 010 is etched back, illustrating side walls 011 of the plug metal films formed as lateral walls of the separation groove 007. FIG. 5C illustrates a cross section after metal wiring 012 is formed and connected to the plug metal film inside the contact hole 009 and a passivation film 013 is then deposited over a semiconductor wafer. FIG. 5D illustrates a cross section when etching for pad opening is performed with the IC region 004 covered with a pad etching resist 014. It has been found that, when a part of the passivation film 013 is removed by etching to expose the underlayer, abnormal discharge 015 is generated on the side wall 011 of the plug metal film, resulting in a difficulty of wafer surface burning. It has been recognized that the difficulty described above needs to be further addressed.

SUMMARY OF THE INVENTION

The present invention has been made in view of the above-mentioned problem.

In order to solve the above-mentioned problem, the present invention employs the following measures.

First, there is provided a semiconductor device having a scribe region and an IC region, including: a first insulating film formed on a semiconductor substrate, the first insulating film in the scribe region including at least one separation groove; side walls which are made of plug metal films and formed as lateral walls of the at least one separation groove; and a second insulating film covering at least the side walls.

Further, in the semiconductor device, the second insulating film is a passivation film.

Still further, in the semiconductor device, bottom parts of the opposing side walls made of the plug metal films in the separation groove are brought into contact with each other.

Then, there is provided a manufacturing method for a semiconductor device including: forming a first insulating film on a semiconductor substrate, forming a contact hole and a separation groove in the first insulating film simultaneously; depositing a plug metal film on the first insulating film and an exposed part of the semiconductor substrate, thereby completely filling the plug metal film at least in the contact hole; etching back the plug metal film to form side walls on lateral walls of the separation groove; depositing a second insulating film on the side walls; patterning a resist film for etching so as to cover at least the second insulating film above the separation groove; and performing dry etching on the second insulating film as an underlayer, with the resist film for etching used as a mask.

Further, in the manufacturing method for a semiconductor device, the second insulating film is a passivation film.

Still further, in the manufacturing method for a semiconductor device, the resist film for etching is a photosensitive polyimide.

Employing the above-mentioned measures makes it possible to manufacture a semiconductor device which is free from abnormal discharge on the side wall, which is made of the plug metal film during dry etching, in a semiconductor wafer in which the separation grooves are provided as preventive measure against peeling of inter-layer insulating films caused after dicing.

BRIEF DESCRIPTION OF THE DRAWINGS

In the accompanying drawings:

FIG. 7A is a cross-sectional view illustrating a manufacturing method for the semiconductor device according to the first embodiment of the present invention, illustrating a state after a plug metal film is deposited;

FIG. 7B is a cross-sectional view illustrating the manufacturing method for the semiconductor device according to the first embodiment of the present invention, illustrating a state after the plug metal film is etched back;

FIG. 7C is a cross-sectional view illustrating the manufacturing method for the semiconductor device according to the first embodiment of the present invention, illustrating a state after a passivation film is deposited; and FIG. 7D is a cross-sectional view illustrating the manufacturing method for the semiconductor device according to the first, embodiment of the present invention, illustrating a state in which dry etching of the passivation film for opening a pad is completed.

DETAILED DESCRIPTION OF THE PREFERRED EMBODIMENTS

Figure 1:
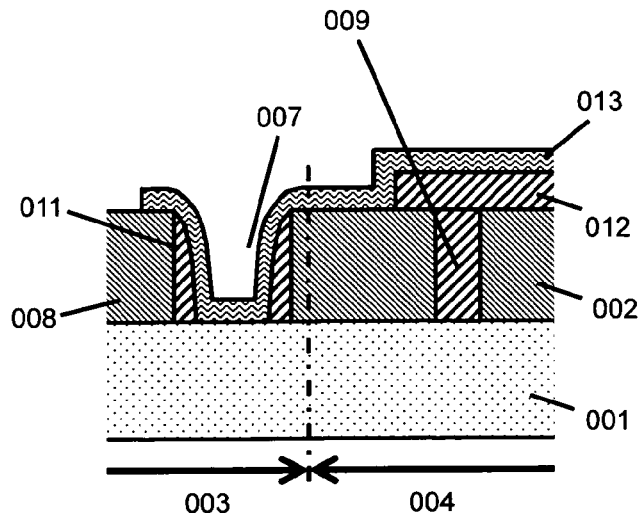
FIG. 1 is a cross-sectional view of a semiconductor device illustrating a first embodiment of the present invention.

FIG. 1 is a cross-sectional view of a semiconductor device illustrating a first embodiment of the present invention. The semiconductor device according to the present invention includes a scribe region 003 and an IC region 004, both of which have inter-layer insulating films 002 (first insulating films) on the same semiconductor substrate 001. In the IC region 004, a contact hole 009 is opened in the inter-layer insulating film 002 and completely filled with a plug metal film. On an upper surface of the inter-layer insulating film 002, metal wiring 012 is formed to be connected to the plug metal film. Then, a passivation film 013 (second Insulating film) is provided so as to cover the metal wiring 012 and the inter-layer insulating film 002, except for a pad opening portion (not shown).

In the scribe region 003, on the other hand, a separation groove 007 is formed in the inter-layer insulating film 002 on the semiconductor substrate 001, and side walls 011 of plug metal films are formed only on lateral walls of the separation groove 007 so that the plug metal films on the lateral walls do not extend out of the separation groove 007 and do not exist on the upper surface of the inter-layer insulting film 002. The passivation film 013 completely covers the side walls 011 of the plug metal films. After dicing, the left end of the scribe region 003 of FIG. 1 constitutes an end surface of a semiconductor chip, and the left side of the end surface is a region which is cut and removed by dicing (see, symbol 006 of FIG. 4B). This structure prevents film peeling due to damage by dicing from the end surface of the semiconductor chip toward the internal IC region 004, and also prevents abnormal discharge during etching for pad opening.

Figure 4A:
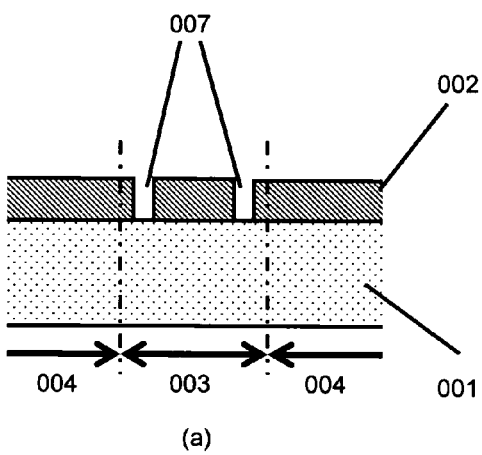
FIG. 4A is a cross-sectional view of a semiconductor device for solving the problem of film peeling, illustrating a state before dicing.
Figure 4B:
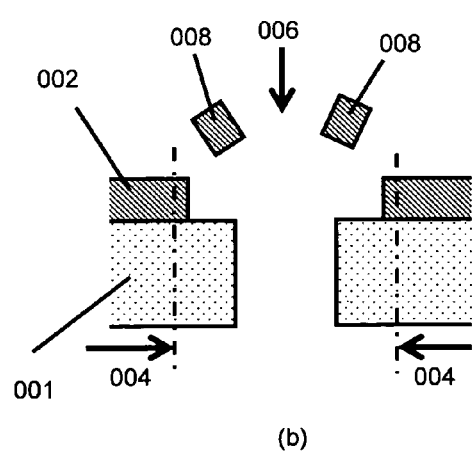
FIG. 4B is a cross-sectional view of the semiconductor device for solving the problem of film peeling, illustrating a state after dicing.
Figure 5A:
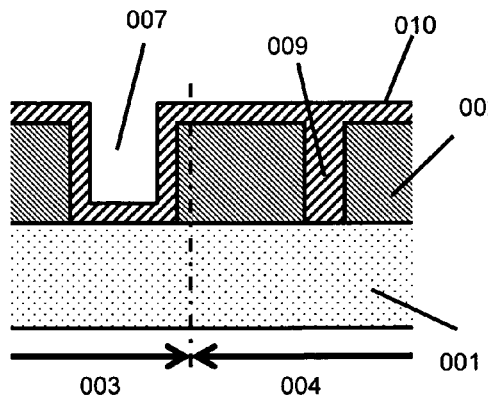
FIG. 5A is a cross-sectional view illustrating a problem which occurs when a conventional technology of FIGS. 4A and 4B and a plug technology are used in combination, illustrating a state after a plug metal film is deposited.
Figure 5B:
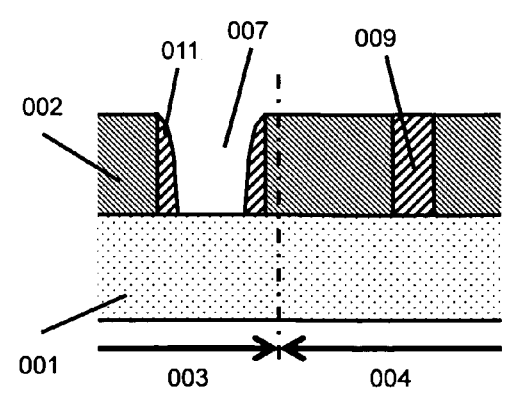
FIG. 5B is a cross-sectional view illustrating the problem which occurs when the conventional technology of FIGS. 4A and 4B and the plug technology are used in combination, illustrating a state after the plug metal film is etched back.
Figure 5C:
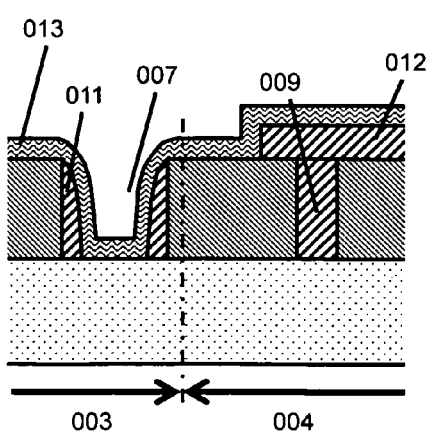
FIG. 5C is a cross-sectional view illustrating the problem which occurs when the conventional technology of FIGS. 4A and 4B and the plug technology are used in combination, illustrating a state after a passivation film is deposited.
Figure 5D:
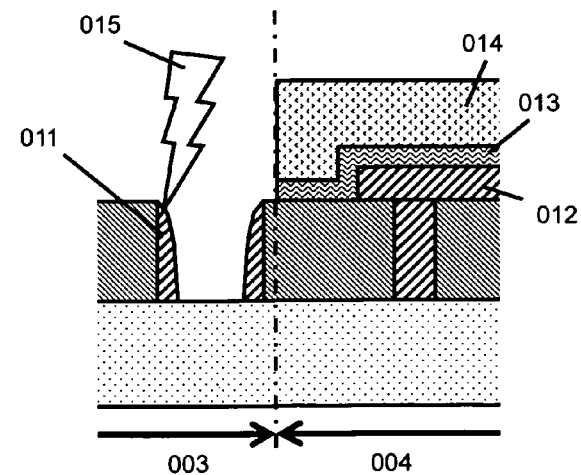
FIG. 5D is a cross-sectional view illustrating the problem which occurs when the conventional technology of FIGS. 4A and 4B and the plug technology are used in combination, illustrating the course of dry etching of the passivation film for opening a pad.

Although the description that the small pieces 008 are scattered is given by referring to FIG. 4B, according to the present invention, the small piece 008 of the inter-layer insulating film 002 on the left end of FIG. 1 is in contact with the side wall 011 of the plug metal film and the passivation film 013, which significantly prevents the inter-layer insulating film 002 from being scattered as a small piece.

Figure 2:
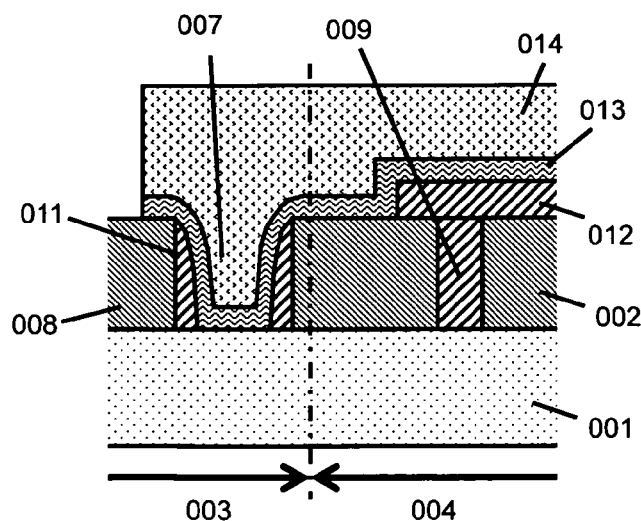
FIG. 2 is a cross-sectional view illustrating a manufacturing method for the semiconductor device according to the present invention, illustrating a state in which etching is completed.
Figure 3A:
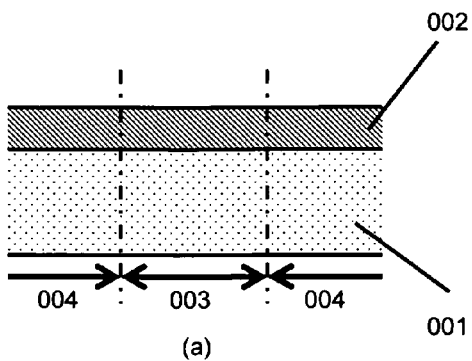
FIG. 3A is a cross-sectional view illustrating a problem of film peeling inherent in a conventional semiconductor device, illustrating a state before dicing.
Figure 3B:
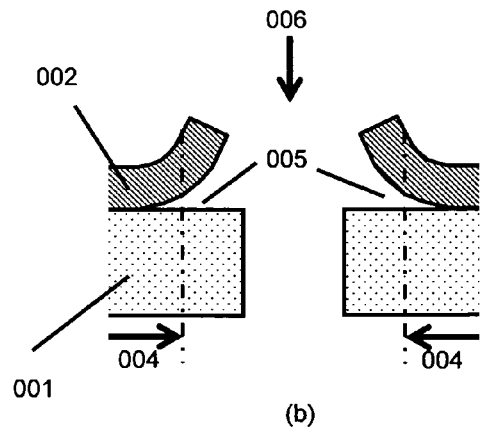
FIG. 3B is a cross-sectional view illustrating the problem of film peeling inherent in the conventional semiconductor device, illustrating a state after dicing.

FIG. 2 is a view schematically illustrating a shape when dry etching for forming the passivation film 013 illustrated in FIG. 1 is completed. A resist film 014 covers the passivation film 013 above the separation groove 007, thereby preventing the passivation film 013 from being etched.

Figure 6:
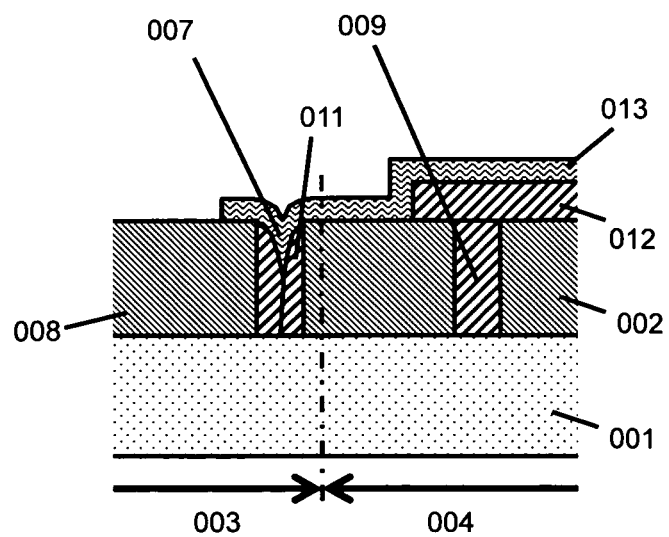
FIG. 6 is a cross-sectional view of a semiconductor device illustrating a second embodiment of the present invention.

In the above-mentioned embodiment, the separation groove is exemplified as having an opening width not less than twice the film thickness of the plug metal film. Alternatively, however, as in a second embodiment of the present invention illustrated in FIG. 6, the separation groove may have an opening width less than twice the film thickness of the plug metal film. In this case, the separation groove is sufficiently filled with the plug metal films, and the opposing side walls 011 formed on both of the lateral walls of the separation groove each have a film thickness half or more the opening width of the separation groove 007 at the bottom part of the separation groove 007. In the resultant semiconductor device, the bottom parts of the opposing side walls 007 are brought into contact with each other to hold the small pieces more solidly.

Next, a manufacturing method for the semiconductor device according to the present invention is described with reference to FIGS. 7A to 7D.

First, as illustrated in FIG. 7A, the contact hole 009 is formed in the inter-layer insulating film 002 on the semiconductor substrate 001 and simultaneously the separation groove 007 is provided therein. Then, a plug metal film 010 is deposited on the inter-layer insulating film 002 and an exposed part of the semiconductor substrate 001. At this time, the contact hole 009 with a small opening is completely filled with the plug metal film 010, whereas the separation groove 007 with a large opening is not filled with the plug metal film 010 but the plug metal film 010 is deposited along the bottom part and lateral walls of the separation groove 007.

Next, as illustrated in FIG. 7B, the deposited plug metal film 010 is etched back so that the side wall 011 of the plug metal film is formed on each lateral wall of the separation groove 007 and that the contact hole 009 in which the plug metal film is filled to the upper part is formed.

Then, as illustrated in FIG. 7C, the metal wiring 012 is formed to be connected to the plug metal film inside the contact hole 009, and the passivation film 013 is thereafter deposited on the semiconductor wafer.

Further, the resist 014 for pad opening is patterned as illustrated in FIG. 7D. In other words, in the IC region 004, the resist film 014 is provided so as to cover the passivation film 013 except for a pad opening portion (not shown), whereas in the scribe region 003, the resist film for pad etching 014 is patterned so as to cover at least the passivation film 013 above the separation groove 007. The resist film for pad etching 014 is used as a mask to etch the passivation film 013 as the underlayer. In the etching, a pad is opened in the IC region 004, and in the scribe region 003, the passivation film 013 provided in the region to be cut and removed by dicing is removed while leaving the passivation film 013 covering the small piece 008 of the inter-layer insulating film 002 and the separation groove 007.

By employing the manufacturing method as described above, the side walls 011 of the plug metal films are not exposed to etching plasma during etching for pad opening, thereby preventing abnormal discharge.

The above-mentioned embodiments have exemplified the use of a resist for pattering the passivation film. Alternatively, however, in the manufacturing method, a photosensitive polyimide may be used instead of the resist, and the photosensitive polyimide may be patterned into a predetermined shape and thereafter used as a mask to etch the underlying passivation film.

Further, the above-mentioned embodiments have exemplified the case where the metal wiring is a single layer, but the present invention is also applicable to multi-layered wiring.

As described above, the present invention is not limited to the above-mentioned embodiments, and may be modified and embodied without departing from the gist thereof.

What is claimed is:

1. A semiconductor chip having a scribe region and an IC region and being obtained by dicing a semiconductor wafer along a dicing line, the semiconductor wafer comprising:
    a semiconductor substrate;
    a first insulating film disposed on the semiconductor substrate across the scribe region and the IC region of the semiconductor chip;
    a separation groove provided in the first insulating film in the scribe region and spaced apart from the dicing line, the separation groove having a bottom portion exposing a surface of the semiconductor substrate;
    a plug metal film formed on lateral walls of the separation groove so that the plug metal film on the lateral walls does not extend out of the separation groove and does not exist on an upper surface of the first insulating film; and
    a second insulating film covering the IC region and extending contiguously therefrom toward the scribe region and into the separation groove so as to cover the plug metal film formed on the lateral walls of the separation groove.

2. A semiconductor chip according to claim 1, wherein the second insulating film is a passivation film.

3. A semiconductor chip according to claim 1, wherein the separation groove has an opening width that is not less than twice a thickness of the plug metal film.

4. A semiconductor chip according to claim 1, wherein the second insulating film is disposed in direct contact with the exposed surface of the semiconductor substrate at the bottom portion of the separation groove.

5. A semiconductor chip according to claim 1, wherein the plug metal film formed on the lateral walls of the separation groove is disposed under and are completely covered by the second insulating film.

6. A semiconductor chip according to claim 1, wherein the second insulating film extends into the separation groove from the upper surface of the first insulating film to the bottom of the separation groove as to cover the exposed surface of the semiconductor substrate.

7. A semiconductor chip according to claim 1, wherein the second insulating film extends into the separation groove but does not reach the exposed surface of the semiconductor substrate.

8. A semiconductor chip having a scribe region and an IC region and being obtained by dicing a semiconductor wafer along a dicing line, the semiconductor chip comprising:
    a semiconductor substrate;
    a first insulating film disposed on the semiconductor substrate across the scribe region and the IC region of the semiconductor chip;
    at least one separation groove provided in the first insulating film in the scribe region and spaced apart from the dicing line;
    a plug metal film formed only on lateral walls of the separation groove so that the plug metal film on the lateral walls does not extend out of the separation groove and does not exist on an upper surface of the first insulating film; and
    a second insulating film extending into the separation groove and covering at least the plug metal film formed on the lateral walls of the separation groove so that the plug metal film is disposed under the second insulating film.

9. A semiconductor chip according to claim 8, wherein the separation groove has an opening width that is not less than twice a thickness of the plug metal film.

10. A semiconductor chip according to claim 8, wherein the second insulating film is a passivation film.

11. A semiconductor chip having a scribe region and an IC region and being obtained by dicing a semiconductor wafer along a dicing line, the semiconductor chip comprising:
    a semiconductor substrate;
    a first insulating film disposed on the semiconductor substrate across the scribe region and the IC region of the semiconductor chip;
    at least one separation groove provided in the first insulating film in the scribe region and spaced apart from the dicing line;
    a plug metal film formed on lateral walls of the separation groove; and
    a second insulating film extending into the separation groove and covering at least the plug metal film formed on the lateral walls of the separation groove so that the plug metal film is disposed under the second insulating film.

12. A semiconductor chip according to claim 11, wherein the separation groove has an opening width that is not less than twice a thickness of the plug metal film.

13. A semiconductor chip according to claim 11, wherein the separation groove has an opening width that is less than twice a thickness of the plug metal film.

14. A semiconductor chip according to claim 11, wherein the second insulating film is a passivation film.

15. A semiconductor chip according to claim 11, wherein the plug metal film is formed only on the lateral walls of the separation groove so that the plug metal film is not formed on any surface of the first insulating film other than surfaces of the first insulating film corresponding to the lateral walls of the separation groove.

* * * * *